United States Patent [19]
Quigg

[11] Patent Number: 5,121,176
[45] Date of Patent: Jun. 9, 1992

[54] MOSFET STRUCTURE HAVING REDUCED GATE CAPACITANCE

[76] Inventor: Fred L. Quigg, 753 Camino Manzanas, Thousand Oaks, Calif. 91360

[21] Appl. No.: 687,778

[22] Filed: Apr. 19, 1991

Related U.S. Application Data

[63] Continuation of Ser. No. 473,504, Feb. 1, 1990, abandoned.

[51] Int. Cl.$^5$ .............. H01L 29/10; H01L 29/68; H01L 29/78
[52] U.S. Cl. ................... 357/23.4; 357/23.3; 357/23.8; 357/23.14; 357/86
[58] Field of Search ............ 357/23.4, 23.3, 23.8, 357/86, 23.14

[56] References Cited

U.S. PATENT DOCUMENTS

| | | |
|---|---|---|
| 4,290,077 | 9/1981 | Ronen ............... 357/23.4 |
| 4,455,565 | 6/1984 | Goodman et al. ....... 357/23.4 |
| 4,969,020 | 11/1990 | Matsushita et al. ...... 357/234 |

FOREIGN PATENT DOCUMENTS 0153368  9/1983  Japan .................. 357/23.4

Primary Examiner—Rolf Hille
Assistant Examiner—Wael Fahmy
Attorney, Agent, or Firm—Skjerven, Morrill, MacPherson, Franklin & Friel

[57] ABSTRACT

In one embodiment, a vertical MOSFET is formed having a lower gate portion overlying the channel region of the MOSFET and separated from the channel region by a thin gate oxide layer. An upper gate portion is formed overlying the drain of the MOSFET and separated from the drain by a relatively thick oxide layer. In this particular embodiment, since the dielectric thickness between the upper gate portion and the drain is relatively large, the MOSFET exhibits a lower gate-drain capacitance ($C_{GD}$) value, while the threshold voltage of the MOSFET remains relatively unchanged. The upper gate portion may be electrically connected to the lower gate portion or may be electrically isolated from the lower gate portion. A preferred method of forming the resulting MOSFET having this lowered $C_{GD}$ allows the source and body regions to be precisely aligned with the drain edge of the lower gate portion.

15 Claims, 7 Drawing Sheets

MOSFET STRUCTURE HAVING REDUCED GATE CAPACITANCE

This application is a continuation of U.S. patent application Ser. No. 07/473,504, filed Feb. 1, 1990, now abandoned.

FIELD OF THE INVENTION

This invention relates to metal-oxide-semiconductor field effect transistors (MOSFETs) and in particular, to an improved structure of a MOSFET having reduced gate capacitance and increased switching speed.

BACKGROUND OF THE INVENTION

It is generally desirable to construct electrical circuits capable of high speed operation. In an electrical circuit containing MOSFETs, this requires the MOSFETs themselves to have rapid response to input signals. A significant barrier to achieving higher operating speeds of MOSFETs has been overcoming the parasitic gate capacitance of the MOSFET, where a significant amount of delay is incurred while charging and discharging the gate of the MOSFET to a certain voltage in order to amplify a signal or to fully switch the MOSFET on and off.

FIG. 1a shows a representative vertical MOSFET with the gate-source parasitic capacitance ($C_{GS}$) and the gate-drain parasitic capacitance ($C_{GD}$) shown. Also shown in FIG. 1a is the drain-source parasitic capacitance ($C_{DS}$).

To operate the N channel MOSFET of FIG. 1a, a positive voltage $V_{DD}$ is applied to drain terminal 20, while a low voltage (e.g., ground) is applied to source regions 30 and body regions 34. Source regions 30 and body regions 34, which constitute the emitter and base of a parasitic NPN bipolar transistor, are imperfectly shorted together by contacts 36 to prevent these regions from being forward biased. Conductive gate 38 is insulated from source regions 30 and body regions 34 by a gate oxide. When a gate-source voltage $V_{GS}$ is applied to gate 38 which exceeds the threshold voltage $V_T$ of the MOSFET, an ohmic channel forms in body regions 34 under gate 38 so as to ohmically couple N-type source regions 30 to N-type drain 40. Current is then conducted between source contacts 36 and drain terminal 20. When the MOSFET is in its off state, a depletion region, represented by dashed outline 44, is created within drain 40.

A basic equivalent circuit for the MOSFET of FIG. 1a is shown in FIG. 1b. As shown in FIG. 1b, for the gate 50 to have a voltage $V_G$ necessary to fully turn on MOSFET 52, both $C_{GS}$ and $C_{GD}$ must be fully charged. Capacitance $C_{DS}$ will be considered herein to approximate zero. Also shown in FIG. 1b is input gate current $I_G$ and current $I_{CGD}$ charging capacitor $C_{GD}$. Note that source region 30, body region 34, and drain 40 form a parasitic NPN bipolar transistor within the MOSFET, as shown in FIG. 1b.

A vertical MOSFET, such as shown in FIG. 1a, is typically a polysilicon gate device, where the gate 38 is used as a diffusion mask to self-align source regions 30 and body regions 34.

FIG. 2 illustrates the voltage conditions during a dynamic switching operation for a representative MOSFET showing the effects of the charging of capacitances $C_{GS}$ and $C_{GD}$ with a constant current $I_G$ applied at t=0. In region 1 of the graph of FIG. 2, the MOSFET is off, with $V_{GS}$ below the threshold voltage $V_T$. Input gate current $I_G$ is shared between $C_{GD}$ and $C_{GS}$ according to their capacitance ratio. Within region 2, the threshold voltage $V_T$ is reached and the MOSFET begins to turn on, lowering the drain-to-source voltage $V_{DS}$. This changing $V_{DS}$ sets up a condition where the voltage is changing more rapidly across $C_{GD}$ than $C_{GS}$. Current increases in $C_{GD}$ and decreases in $C_{GS}$, thus reducing the rate at which $V_{GS}$ is increasing. As $V_{GS}$ becomes larger, the dv/dt of the drain-to-source voltage $V_{DS}$ increases until the current $I_{CGD}$ charging $C_{GD}$ reaches a magnitude equal to $I_G$, and $V_{GS}$ no longer increases. This condition results in the flat portion of the $V_{GS}$ curve in region 3 of FIG. 2.

During this time, the depletion region under the gate, generally shown as depletion region 44 in FIG. 1a, decreases since the potential of drain 40 under gate 38 is lowered due to this region being pulled down by the increasing ohmic channel between N-type source region 30 and N-type drain 40. During the entire turn-on period of the MOSFET, capacitance $C_{GD}$ is increasing due to this narrowing of the effective insulation between the plates of the equivalent capacitor $C_{GD}$. As this capacitance increases, a decreasing dv/dt of the drain-to-source voltage $V_{DS}$ results. This increase in capacitance $C_{GD}$ is reflected in the curved lower portion of $V_{DS}$ shown in FIG. 2.

Once capacitance $C_{GD}$ has stabilized, the MOSFET is essentially fully on, and $C_{GD}$ does not cause any further switching delay.

As seen by the gate charge characteristics of FIG. 2, the delay in switching of the MOSFET is significantly affected by capacitance $C_{GD}$, where capacitance $C_{GD}$ is more commonly referred to as the reverse transfer capacitance ($C_{rss}$). Since, as shown in FIG. 2, capacitance $C_{GD}$ is affected by voltage changes at the drain, it becomes understandable how the effective total gate capacitance ($C_{in}$) of the MOSFET under dynamic conditions is calculated using the following equation:

$$C_{in} = C_{GS} + C_{GD}(1 - A_V), \qquad \text{(eq. 1)}$$

where $A_V = dV_{DS}/dV_{GS}$. For an N channel MOSFET, $dV_{DS}$ will be a negative value, and for a P channel MOSFET, $dV_{GS}$ will be a negative value. Thus, in either case, $(1 - A_V)$ is equal to (1 + voltage gain).

It is also to be noted that essentially the same gate charge characteristics are encountered with the discharging of the gate, which causes the turn-off speed of the MOSFET to be delayed. In linear applications, such as radio frequency (RF) power amplification, input capacitance largely determines the upper frequency limit of the MOSFET.

Typically, the value $C_{GD}(1 - A_V)$ is at least three times greater than $C_{GS}$, and thus any reduction of capacitance $C_{GD}$ will significantly lower the switching time of the MOSFET, or significantly raise the usable operating frequency.

Capacitance is calculated using the equation:

$$C = AK\epsilon_0/t, \qquad \text{(eq. 2)}$$

where

C is the capacitance;

$\epsilon_0$ is the permittivity of empty space ($8.85 \times 10^{-2}$ coul$^2$/newton$^2$-m$^2$);

K is the dielectric constant (3.9 for $SiO_2$ and 11.7 for Si);

A is the plate area; and t is the dielectric thickness.

Thus, capacitance may be reduced by decreasing the plate area or increasing the dielectric thickness.

The prior art has attempted to reduce the parasitic gate capacitance of a MOSFET by reducing the area of the gate and/or increasing the effective dielectric thickness between the gate and the drain.

Two types of approaches which have been previously used to reduce $C_{GD}$ are shown in FIGS. 3 and 4 where, in FIG. 3, an increased thickness of dielectric 60 is formed over drain 62 to provide an increased dielectric thickness between gate 64 and drain 62. The gate-source capacitance $C_{GS}$ is essentially unchanged, since the thickness of the dielectric separating gate 64 from source region 66 is essentially unchanged.

Prior art FIG. 4 illustrates an approach where an N channel vertical MOSFET uses two separate gates 70 and 72 commonly connected to a gate voltage $V_G$. Since the effective area of the gate over drain 76 is decreased, the $C_{GD}$ is also decreased.

One drawback of the MOSFET of prior art FIG. 3 is that gate 64 may be misaligned with respect to raised dielectric portion 60, causing part of the device to have low gain. In FIG. 4, a center portion of the gate oxide 70 over drain 76 must be masked and protected while body regions 78 and source regions 74 are formed self-aligned with the gate. Also in FIG. 4, the width of gate elements 72 is subject to mask and photoresist variations, which cause variations in $C_{GD}$ across a wafer and from lot to lot. The critical masking steps required to form raised dielectric portion 60 in FIG. 3 and to perform the precise etching of the gate in FIG. 4 require a relatively precise alignment of the mask, or relatively precise process and mask control, thus inevitably resulting in lower yields and variable performance devices.

Another drawback to the MOSFET in FIG. 3 is the imperfect short across the emitter-base of the parasitic bipolar transistor. Under certain adverse conditions, the bipolar transistor may be turned on to the extent of causing secondary breakdown and device failure. Manufacturers have addressed this problem by: 1) reducing the depth of the N+ source diffusion to lower beta; 2) moving the P+ body contact region closer to the channel region to reduce resistance between the emitter and base; and 3) reducing the lateral dimension of the N+ source region to lower the resistance between the emitter and base.

What is needed in the art is a MOSFET structure having a relatively low $C_{GD}$ and an inoperative parasitic bipolar transistor which may be formed with self-aligned source, body, and body contact regions and which may be formed without requiring numerous and difficult process steps.

SUMMARY OF THE INVENTION

The above-described disadvantages of the prior art MOSFETS have been overcome by the invention described herein. In accordance with one embodiment of the invention, a vertical MOSFET is formed having a lower gate portion overlying the channel region of the MOSFET and separated from the channel region by a thin gate oxide layer. An upper gate portion is formed overlying the drain of the MOSFET and separated from the drain by a relatively thick self-aligned oxide layer. In this particular embodiment, since the dielectric thickness between the upper gate portion and the drain is relatively large, the MOSFET exhibits a lower gate-drain capacitance ($C_{GD}$) value, while the threshold voltage of the MOSFET remains relatively unchanged. The upper gate portion may be electrically connected to the lower gate portion or may be electrically isolated from the lower gate portion. If the upper gate portion is electrically isolated from the lower gate portion, a separate gate voltage may be connected to the upper gate portion to allow the upper gate portion to either act as a field plate or act to augment the fields generated by the lower gate portion to enhance the current handling capabilities of the MOSFET. A preferred method of forming the resulting MOSFET having this lowered $C_{GD}$ allows the source and body regions to be precisely aligned with the drain edge of the lower gate portion, and allows an ion implant damaged body contact region to be formed directly under, and self-aligned to, the source region, which ensures the parasitic bipolar transistor remains inoperative.

BRIEF DESCRIPTION OF THE DRAWINGS

FIG. 1b is a schematic diagram illustrating an equivalent circuit for the MOSFET of FIG. 1a.

FIG. 16b illustrates with dashed lines the improved gate charge characteristics of the MOSFET of FIG. 16a.

DETAILED DESCRIPTION OF PREFERRED EMBODIMENTS

Figure 5:
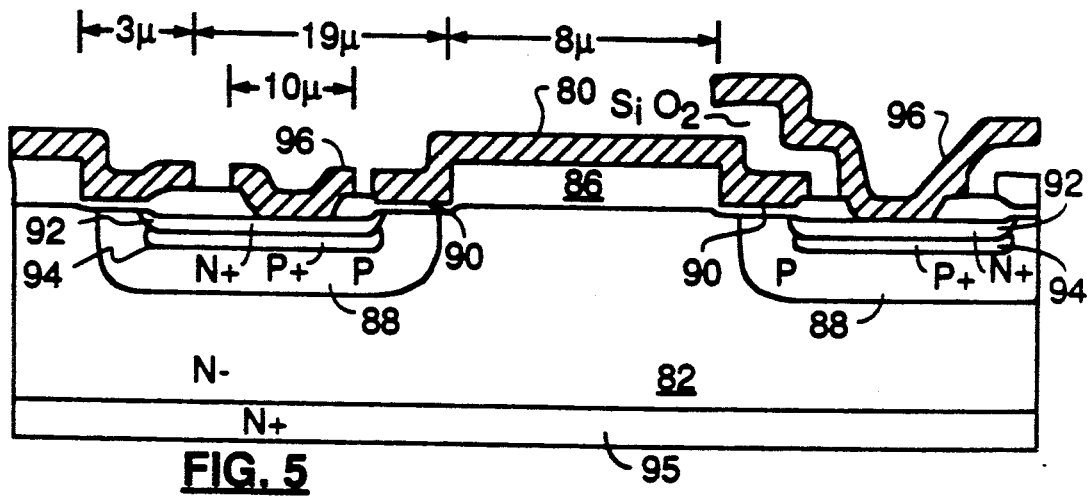
FIG. 5 illustrates an embodiment of the invention wherein a MOSFET for very high frequency (VHF) operation is made to have a relatively low $C_{GD}$.

FIG. 5 shows an embodiment of the invention capable of VHF operation, where conductive gate 80, formed of either Al, Al containing Si, or Al containing Cu and Si, or any other compatible gate material, is formed over drain 82 with a first thickness of oxide 86 therebetween. In one embodiment, oxide 86 is 10,000 Å thick. Gate 80 is also formed over P body regions 88 with a second thickness of oxide 90 therebetween. In one embodiment, oxide 90 is 900 Å thick. Also shown in FIG. 5 is N+ source region 92 and P+ body contact region 94, with conductive source contact 96 shorting together N+ source region 92 and P+ body contact region 94. N+ drain contact 95 is shown contacting a bottom surface of drain 82.

Since oxide layer 86 is significantly thicker than oxide layer 90, the capacitance between gate 80 and drain 82 will be relatively low due to this increased dielectric thickness, while the capacitance between gate 80 and source region 92 will not significantly change. The thickness of gate oxide layer 90 is dictated by design considerations to provide a desired threshold voltage $V_T$ and dielectric breakdown voltage.

Lateral dimensions of the various above-described regions for one embodiment of the invention are shown in FIG. 5.

Thus, in the embodiment of FIG. 5, a gate-to-source voltage $V_{GS}$ will cause the field created between gate 80 and N+ source region 92 and between gate 80 and P− body region 88 to invert the channel region within P− body region 88, causing an ohmic channel to be created between N+ source region 92 and N− drain 82. This inversion of P− body region 88 is primarily due to the field created by the portion of gate 80 located above thin oxide layer 90. The portion of gate 80 overlying thick oxide layer 86 has a reduced effect on the conductance of the MOSFET and provides shielding over drain 82.

FIGS. 6–12 illustrate a method to form the structure of FIG. 5.

Figure 6:
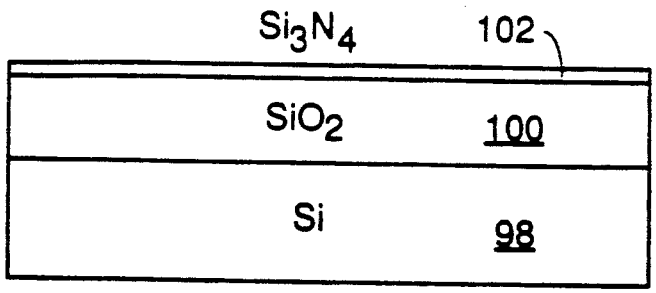
FIGS. 6–12 illustrate various process steps used in one embodiment of a method for forming the VHF MOSFET of FIG. 5.

In FIG. 6, an epitaxial layer 98 of N-type conductivity, having an impurity concentration of approximately $3 \times 10E15$ atoms/cm$^3$ to achieve a breakdown voltage of between 80 to 100 V is deposited on an N+ substrate and has formed over it silicon dioxide layer 100 having a thickness of preferably 10,000 Å.

Oxide layer 100 would be formed to have a thickness of 7,000 Å for embodiments using two metal layers (a gate layer and a source layer). This two metal layer embodiment is illustrated on the right hand side of FIG. 5.

Oxide layer 100 may be formed by wet oxidation at approximately 1,000° C. for 3–5 hours. Over oxide layer 100 is then formed silicon nitride layer 102 by a chemical vapor deposition (CVD) process at approximately 790° C. to achieve a thickness of approximately 1,000 Å.

Figure 7:
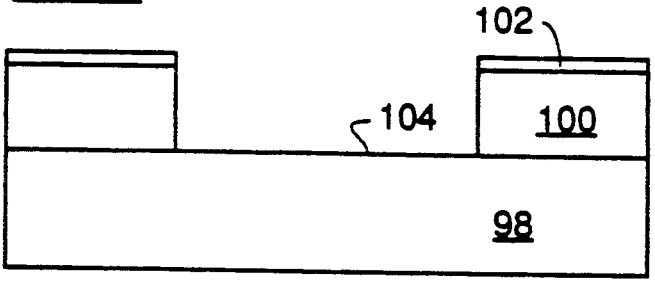

In FIG. 7, oxide layer 100 and silicon nitride layer 102 are etched by using a conventional positive photoresist, contact masking technique and an anisotropic etch to expose portion 104 of substrate 98. In a preferred embodiment, a Lam TM dry etcher is used. The exposed portion 104 of substrate 98 is to coincide with the desired location of the body-source diffusion.

Figure 8:
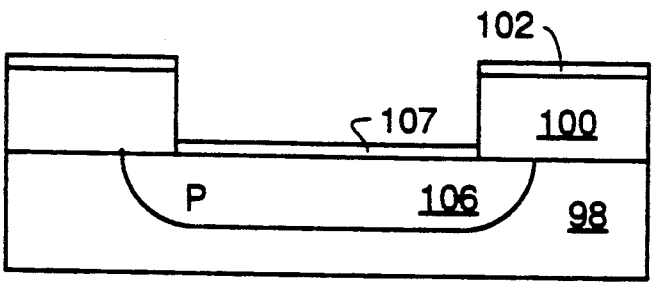

In FIG. 8, boron is implanted into substrate 98 through exposed portion 104 and diffused to form P body region 106 In the preferred embodiment, boron ions are implanted at an energy of 70 KeV with a dosage of $6 \times 10E13/cm^2$. The exposed silicon is then oxidized for 30 minutes at 900° C. in a dry O$_2$ atmosphere to form oxide layer 107 in order to prevent damage to the substrate during a subsequent diffusing process conducted in an N$_2$ atmosphere. The implanted ions are diffused by a ramp up and dwell diffusing process, where the temperature of the wafer is ramped from 900° C. to 1,100° C. at a rate of approximately 8° C./minute and held for approximately 2.5 hours and then ramped down to 900° C. for one hour (including ramping time) in an N$_2$ atmosphere, to form P body region 106 having a depth of approximately two microns. The required characteristics of P body region 106 will depend on the desired breakdown voltage of the device and will be readily apparent to one of ordinary skill in the art.

Figure 9:
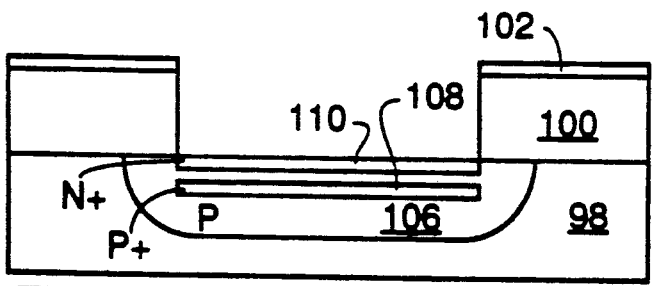

In FIG. 9, an additional boron implant is conducted to form P+ contact region 108 within P body region 106. In the preferred embodiment, boron ions are implanted at an energy of approximately 100 KeV with a dosage of 10E15 to 10E16/cm$^2$. The implant energy is calculated to form P+ region 108 at a depth below the surface of substrate 98 where it is desired to have P+ region 108 interface with a subsequently formed source region. Next, the wafer is dipped in a 10:1, H$_2$O: HF solution for approximately 45 seconds to remove oxide layer 107, and arsenic is implanted to form N+ source region 110 at the surface of substrate 98. In the preferred embodiment, arsenic ions are implanted at an energy of approximately 40 KeV with a dosage of 10E16/cm$^2$.

Figure 10:
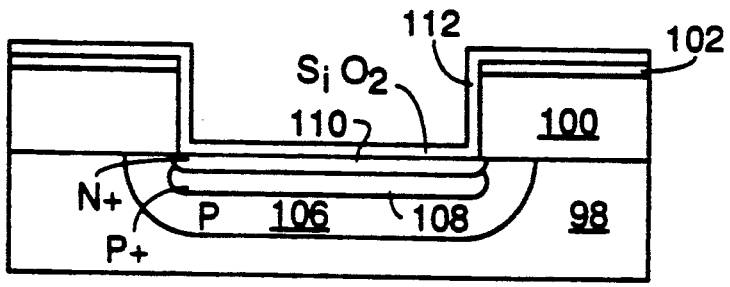

In FIG. 10, silicon dioxide layer 112 is deposited at 400° C. over the surface of the wafer to a thickness of approximately 500 Å to prevent any out-diffusing of arsenic ions forming source region 110. The impurities within N+ source region 110 and P+ body contact region 108 are then driven-in for approximately 30 minutes at approximately 1,000° C. so that N+ source region 110 extends approximately 0.3 microns beneath the surface of substrate 98. During this drive-in period, P+ body contact region 108 and P body region 106 also diffuse.

Figure 11:
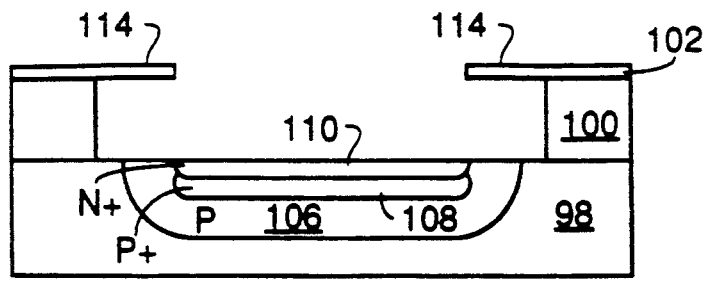

In FIG. 11, an oxide etchant is used to remove oxide layer 112 and a portion of oxide layer 100 so as to leave overhanging silicon nitride portion 114. In the preferred embodiment to conduct this etching, the wafer is immersed in any oxide etch solution with a known and controlled etch rate For example, six parts H$_2$O to one part ammonium fluoride may be used at 25° C. for a period calculated to create the desired overhanging of nitride portion 114 relative to P body 106. For the diffusion process previously described, a 1.4 micron overhang of nitride portion 114 is satisfactory.

Figure 12:
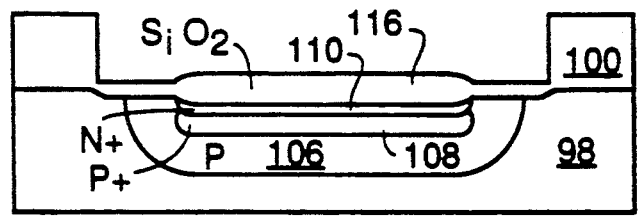

In FIG. 12, the wafer is immersed in hot phosphoric acid (or an equivalent thereof) at a temperature of approximately 160° C. for one hour to remove silicon nitride portion 114 and the remainder of silicon nitride layer 102 over oxide layer 100. As a precaution against arsenic outgassing, the wafer is gradually ramped up to a temperature of 920° in a tube furnace for approximately 15 minutes in a dry O$_2$ atmosphere to form a thin layer of oxide 50-100Å thick. Silicon dioxide layer 116 is then grown over the surface of the wafer at approximately 920° C. for approximately 25 minutes in an atmosphere of wet $O_2$ to a thickness of 2500-3000 Å over N+ source region 110. An increased thickness of oxide layer 116 is inherently formed over N+ source region 110. The portion of oxide layer 116 over P body region 106, forming the gate oxide, will be approximately 900 Å at this stage.

Next, as shown in FIG. 5, a portion of oxide layer 116 over source region 110 is etched to expose a portion of source region 110. In an alternative embodiment, an additional etch is conducted to etch source region 110 through to expose P+ body contact region 108. A conductive metal layer is then formed over the surface of the wafer by the deposition of either Al, Al containing Si, Al containing Cu and Si, or any other conventional metal layer to a thickness of approximately one micron. In the VHF embodiment of the invention, aluminum, copper, and silicon are sputtered over the surface of the wafer. A metal layer containing Si is preferred to minimize migration of the metal atoms into the silicon substrate. For higher frequency embodiments, metal source contact 96 preferably comprises a WTi barrier layer in contact with the source region overlaid by approximately 1 micron of Au.

The resulting metal layer is then masked and etched to form source contact 96 and gate 80 as shown in FIG. 5. Source contact 96 contacts N+ source region 92 and also contacts P+ contact region 94 through N+ source region 92, due to source region 92 and P+ contact region 94 being so highly doped as to be in ohmic contact with each other. Ohmic contact is further enhanced by implant damage to the crystalline substrate.

In an alternative embodiment, source region 92 is anisotropically etched completely through in the contact area so that source contact 96 directly contacts both P+ body contact region 94 and N+ source region 92.

Any embodiment herein may be formed with a tungsten (W) or refractory metal silicide layer deposited prior to the formation of source contact 96 to prevent migration of atoms and/or to reduce contact resistance.

In practice, it is desirable to form source contact 96 close to the channel region to minimize on-resistance.

The method described in FIGS. 6-12 and FIG. 5 forms a MOSFET having a low gate-drain capacitance $C_{GD}$, wherein source region 92, body contact region 94, and body region 88 are formed self-aligned with the drain edge portion of gate 80. In this method to form a VHF MOSFET, there are no critical alignment tolerances, which makes this above-described process one that will inherently result in a high yield of MOSFETs on a wafer.

Figure 13:
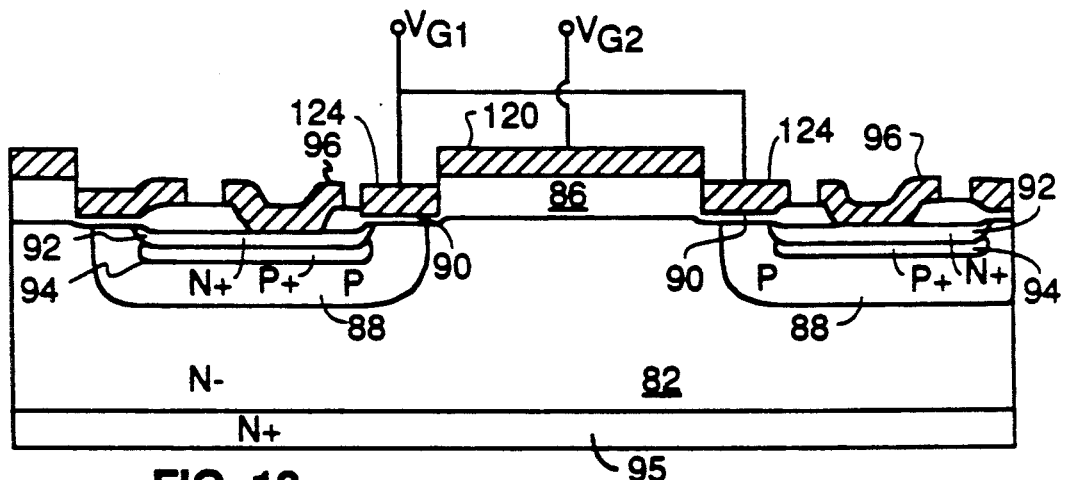
FIG. 13 illustrates an alternative embodiment of a MOSFET capable of ultra high frequency (UHF) operation having a low $C_{GD}$ in accordance with the present invention where upper and lower gates are formed.

In the structure of FIG. 5, the portion of gate 80 formed over thick oxide portion 86 is connected to the portion of gate 80 formed over thin oxide portion 90 by a vertical gate portion. In an alternative embodiment of the MOSFET structure of FIG. 5, the metal layer is formed by a method which will intentionally provide poor step coverage, such as by an evaporation process, so that the vertical portion of gate 80 will be relatively thin compared to the horizontal portions of gate 80. Such a resulting structure, having relatively thin vertical portions of gate 80 is then isotropically etched using a commercially available wet aluminum etch containing phosphoric acid, assuming gate 80 is composed of Al, so as to isolate the portion of gate 80 formed above thick oxide portion 86 from the portion of gate 80 formed above thin oxide portion 90. This embodiment is shown in FIG. 13, where upper gate 120 and lower gates 124 result. The remaining elements in the MOSFET of FIG. 13 are similar to those in FIG. 5 and are formed using a process similar to that described with respect to FIG. 5.

In all the embodiments described herein, for higher frequency operation, the source contact is preferably an overlay metal (such as shown on the right hand side of FIG. 5). This allows P body region 88 to be relatively narrow (~10 microns) for low drain-to-source capacitance $C_{DS}$. The various figures do not incorporate a two metal layer for simplicity.

In the MOSFET structure of FIG. 13, gate voltage is applied to lower gates 124, while a separate voltage is applied to upper gate 120. A positive voltage applied to upper gate 120 will make upper gate 120 effective in creating additional carriers in the N− drain 82 and increasing the current handling capability of the MOSFET. A negative voltage on upper gate 120 will increase the breakdown voltage of the MOSFET.

Figure 14:
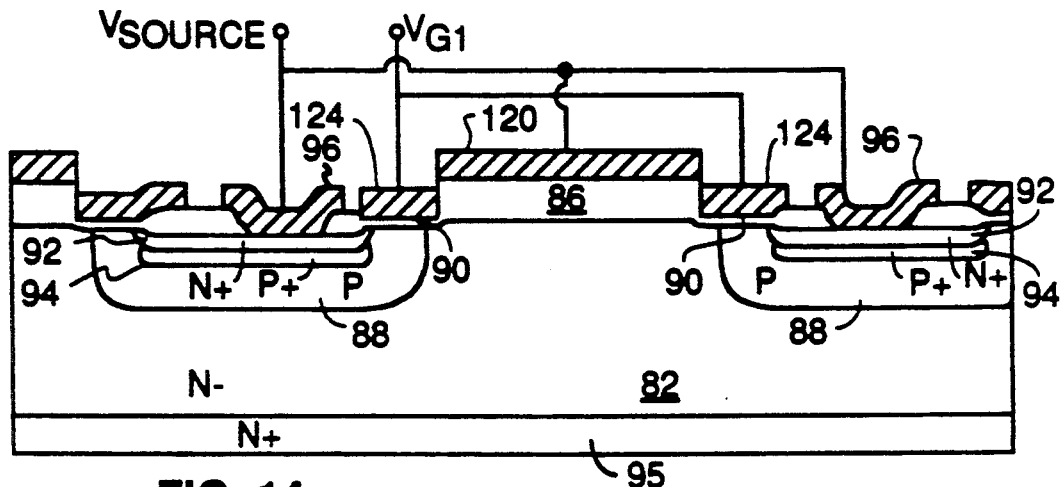
FIG. 14 illustrates the MOSFET of FIG. 13 with an upper gate coupled to source voltage.

In FIG. 14, a structure identical to FIG. 13 is shown except that upper gate 120 is connected to the source voltage instead of to an upper gate voltage. Thus, in this configuration, upper gate 120 acts as a field plate for increasing the depletion region in drain 82 when the MOSFET is in its off state. This serves to enhance the breakdown voltage of the MOSFET.

Figure 15:
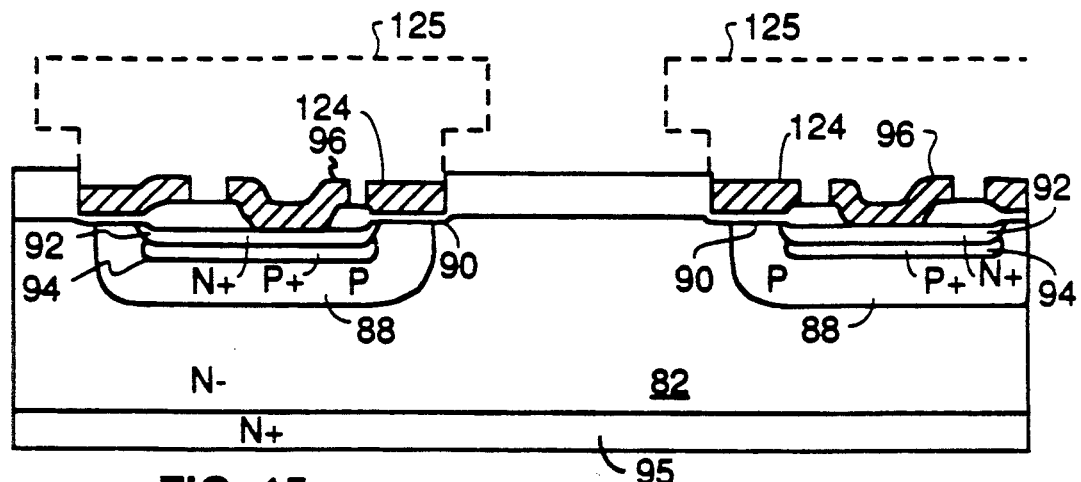
FIG. 15 illustrates an alternative embodiment of a MOSFET having a low $C_{GD}$ in accordance with the present invention where an upper gate is removed.

In an alternative embodiment, shown in FIG. 15, upper metal gate 120 of FIG. 13 is removed using a wet etch process. As shown in FIG. 15, mask 125, shown in dashed outline, is first formed to expose a center portion of the gate metal over oxide 86. The wet etch process removes the exposed metal and also removes the gate metal adjacent the exposed portion. Gate voltage is applied to gates 124 to invert the channel regions in P body regions 88.

Figure 16A:
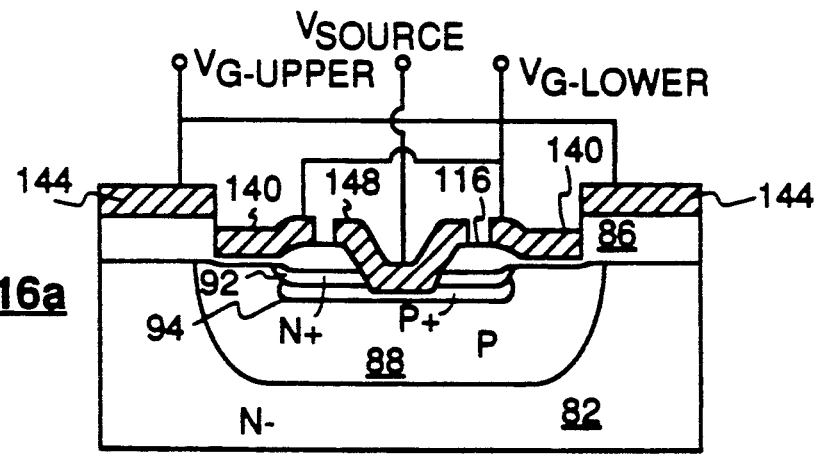
FIG. 16a illustrates an alternative embodiment of a MOSFET capable of UHF to super high frequency (SHF) operation having a very low $C_{GD}$ in accordance with the present invention where a lower gate and an upper gate terminate over a portion of the channel region.
Figure 16B:
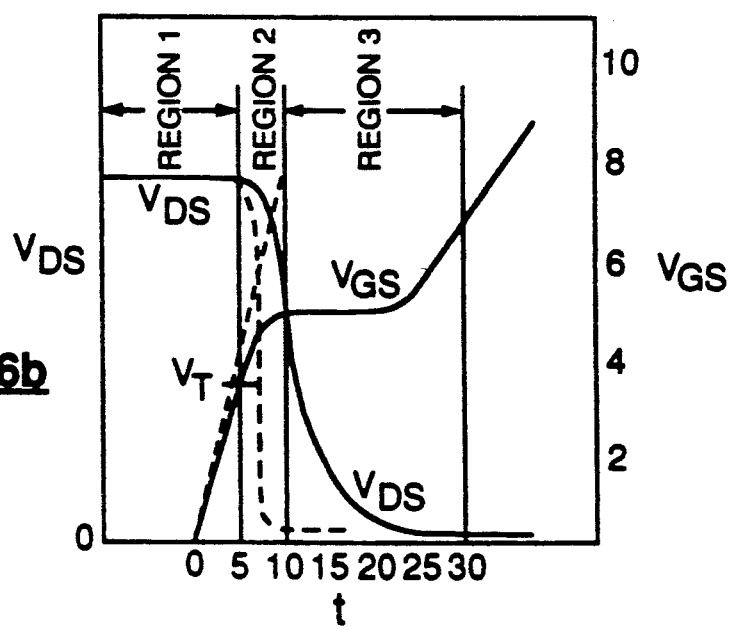

In the highest speed embodiment of the invention, shown in FIG. 16a, lower gate 140 is formed so as to only overlap a portion of the channel region in P body region 88, while upper gate 144 overlaps the remaining portion of the channel region in P body region 88. This configuration further reduces the $C_{GD}$ of the MOSFET, since lower gate 140 is relatively physically distant from drain 82. In this configuration, the field generated by upper gate 144 in conjunction with the field created by lower gate 140 is used to invert the channel region in P body region 88 to form an ohmic channel between N+ source region 92 and N− drain 82.

Figure 17:
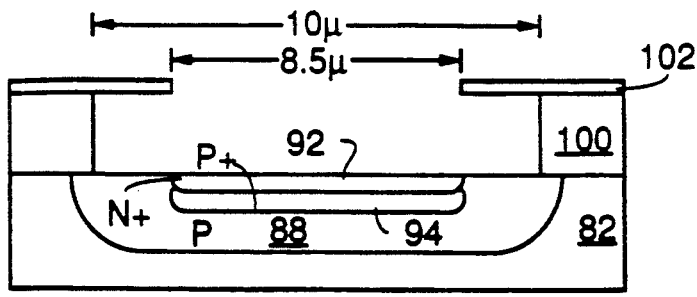
FIGS. 17 and 18 illustrate process steps used to form the MOSFET of FIG. 16.

The structure of FIG. 16a is formed using a method similar to that described with respect to FIG. 5, except that after drive-in of N+ source region 92 and P+ contact region 94, the oxide etch, previously discussed with respect to FIG. 11, is conducted for less time so as to etch away less of oxide layer 100 under silicon nitride layer 102. This is shown in FIG. 17. The terminating portion of oxide layer 100 is located above an exposed portion of P body region 88 where it is desired for lower gate 140 and upper gate 144 to interface. Lateral dimensions of one embodiment are shown in FIG. 17.

Figure 18:
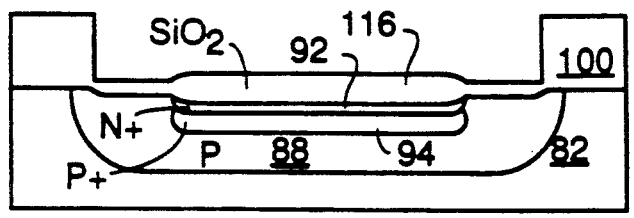

In the step illustrated in FIG. 18, silicon nitride layer 102 is removed, and oxide layer 116 is grown.

As shown in FIG. 16a, oxide 116 is etched, and source region 92 and body contact region 94 are optionally etched in order to short these regions together by a metal source contact. A metal conductive layer is then deposited, preferably by evaporation, so as to provide a metal layer having poor step coverage. This metal layer is then masked and isotropically etched so as to form upper gate 144, lower gate 140, and, optionally, source contact 148. Source contact 148 may also be formed later through an opening in a subsequently deposited oxide layer and oxide portion 116, resulting in a two layer metal embodiment, preferable for high frequency and high density devices.

Figure 1A:
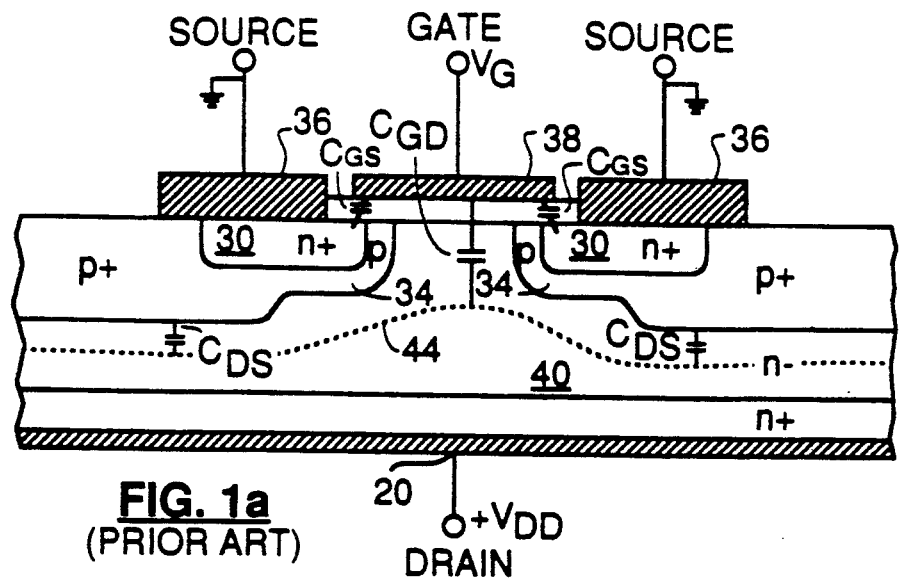
FIG. 1a illustrates a prior art vertical MOSFET.
Figure 1B:
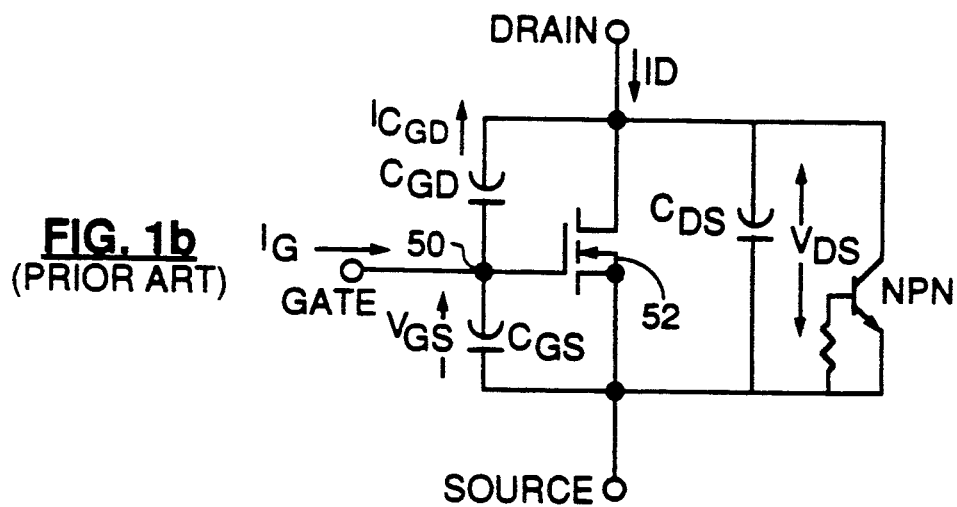
Figure 2:
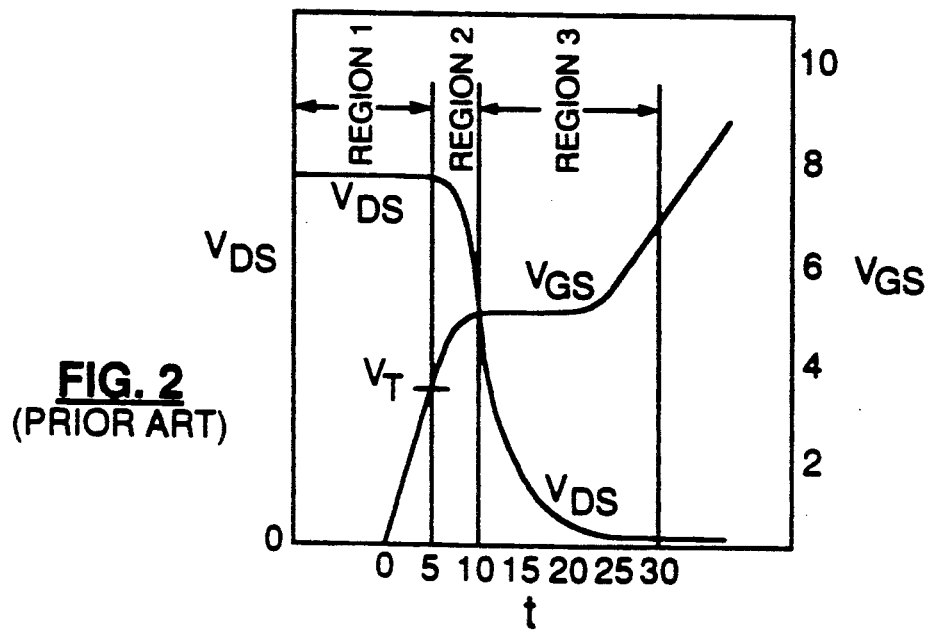
FIG. 2 is a graph showing representative gate charge characteristics of a MOSFET.
Figure 3:
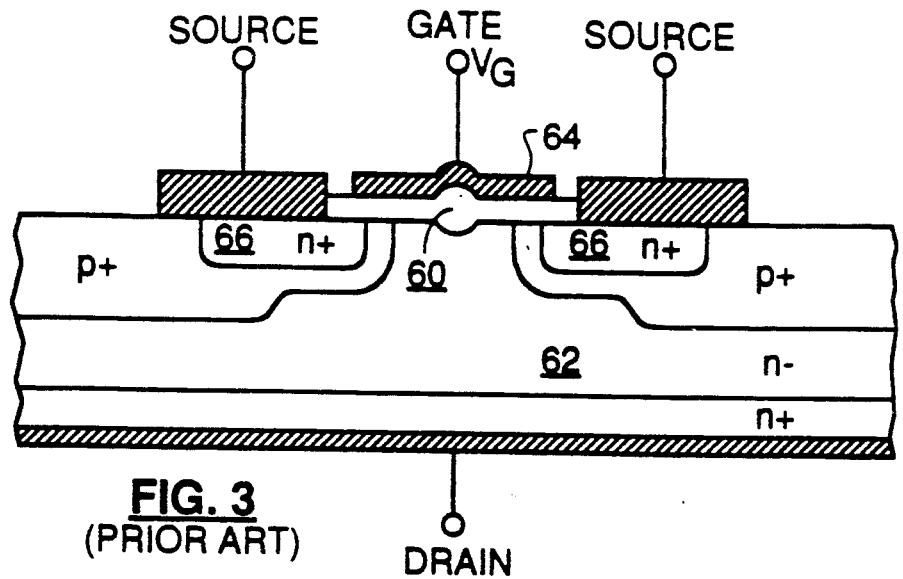
FIG. 3 illustrates a first prior art MOSFET having reduced gate-drain capacitance.
Figure 4:
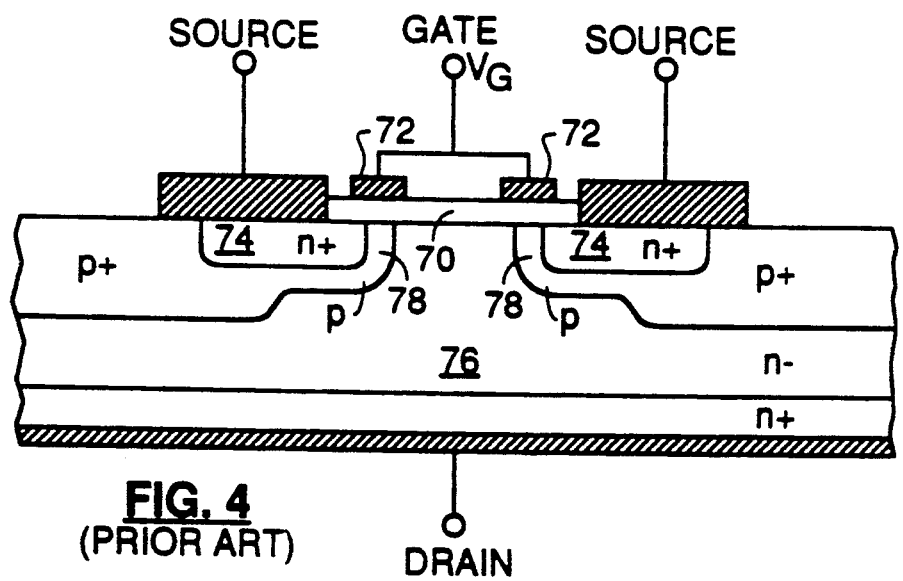
FIG. 4 illustrates a second prior art MOSFET having reduced gate-drain capacitance.

In the structure of FIG. 16a, $C_{GD}$ has been virtually eliminated. Upper gate 144 may be connected to source region 92 through an alternating current (AC) short circuit, and the resulting drain-to-upper gate capacitance, which constitutes $C_{GD}$ (or $C_{rss}$) in the prior art MOSFETs of FIGS. 1, 3 and 4, now appears in this invention as a part of $C_{DS}$. The dramatically improved switching characteristics of the new structure are shown by the broken lines in FIG. 16a superimposed on the gate charge characteristics graph of FIG. 2.

Figure 19:
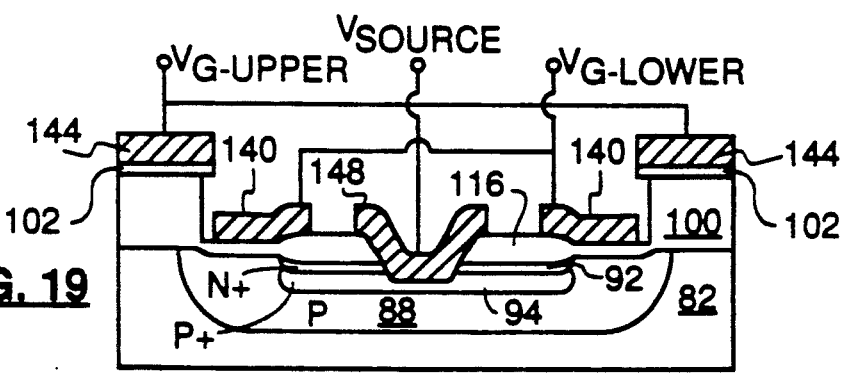
FIG. 19 illustrates an alternative embodiment of a MOSFET having a very low $C_{GD}$ in accordance with the present invention which utilizes an overhanging upper gate to eliminate etching of a vertical portion of the gate.

FIG. 19 illustrates another embodiment of the invention which is a variation of the structure of FIG. 16a. In FIG. 19, upper gate 144 overhangs oxide portion 86. This structure has the advantage in that the channel region between N+ source 92 and drain 82 is completely overlapped by the combination of upper gate 144 and lower gate 140 so as to insure the inversion of the channel region. Further, the structure may be formed without any requirement for an isotropic etch to etch away a vertical portion of the metal layer initially connecting upper gate 144 to lower gate 140.

Figure 20:
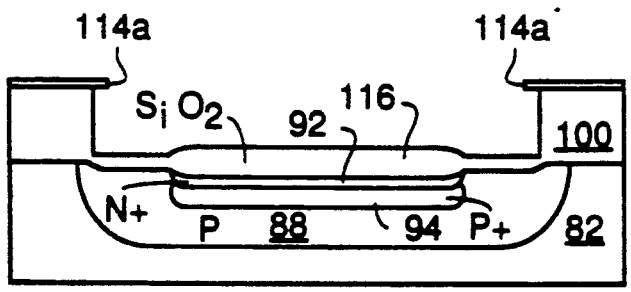
FIG. 20 illustrates a process step used to form the MOSFET of FIG. 19.

The method for forming the structure of FIG. 19 is similar to that for forming the structure of FIG. 5, except, in the process steps illustrated in FIGS. 11 and 12 for forming the MOSFET of FIG. 5, nitride layer 102 is partially etched to 40-50% of its original thickness. This completely removes overhanging nitride portion 114. The sidewalls of oxide portion 100, shown in FIG. 20, is then re-etched 1,000-2,000 Å to create a new small overhanging nitride portion 114A. A metal layer is then deposited by, for example, evaporation, and a vertical portion is not formed on a sidewall of oxide layer 100. The resulting structure is masked and etched to form the structure of FIG. 19.

Figure 21:
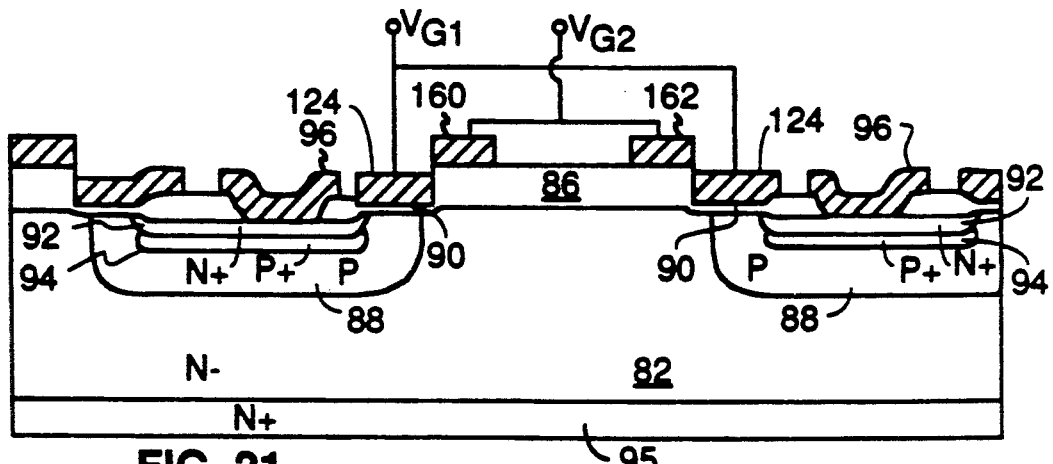
FIG. 21 illustrates an alternative embodiment of a MOSFET having a low $C_{GD}$ in accordance with the present invention which utilizes a split upper gate.

FIG. 21 shows a higher frequency embodiment of the invention which is a variation of the MOSFETs having a separate upper gate. In FIG. 21 upper gates 160 and 162 are shown separated by a gap. This structure results in a lower drain-to-upper gate capacitance $C_{GD}$ due to less upper gate area over drain 82. High current capability is retained by the field created by upper gates 160 and 162. This split upper gate configuration may be used in any of the above-described embodiments including FIG. 5, where gate 80 overlying oxide 86 may be opened up to further reduce $C_{GD}$.

In the high frequency MOSFET of FIG. 21, source contact 96 is preferably comprised of a 2,000 Å WTi barrier layer under a 9,000 Å Au layer in an overlay (two layer metal) configuration. In an embodiment wherein a metal source contact is to directly contact both the P+ body contact region and the N+ source region, as shown in FIG. 19, platinum silicide is preferably used as a contact layer under the WTi to improve ohmic contact.

In one embodiment of the MOSFET of FIG. 21, the starting material is an N+ (antimony) <1-0-0> silicon substrate with an 8 micron epitaxial layer formed therein having a resistivity of 1.5 Ω·cm.

Oxide layer 86 has a thickness of 7,000 Å. Gate oxide 90 has a thickness of 800 Å. The body opening mask through which body region 88 impurities are implanted is 8.5 microns wide. The space between gates 124 is approximately 25 microns. The source contact mask opening is 2 microns. The gate 124, 160, 162 length is approximately 2.5 microns.

The implant doses are as follows:
For P body region 88: $5 \times 10E13/cm^2$ at 70 KeV using boron ions;
For P+ body contact region 94: $1 \times 10E15/cm^2$ at 100 KeV using boron ions; and,
For source region 92: $1 \times 10E16/cm^2$ at 40 KeV using arsenic ions.

The channel length is approximately 1 micron, and the channel width is approximately 1100 microns.

The resulting structure has the following electrical properties:
$V_{TH}$@25μA: 1.0-1.5 V
$BV_{DSS}$@250μA: 80 V
gm@25mA, $V_D$=10 V: 0.025 mhos
$RD_{ON}$@$V_G$ =10 V: 32 ohms At $V_G = 0V$, $V_D = 28$ V:
$C_{iss}$ ~ 1.25 pf    ($C_{GS} + C_{GD}$)
$C_{rss}$ ~ 0.0425 pf   ($C_{GD}$)
$C_{Oss}$ ~ 0.625 pf    ($C_{DS} + C_{GD}$)

When overlay metal is used, a Faraday shield is preferably connected to the source contact and placed between the gate bonding pad and the drain to prevent pad capacitance from becoming part of $C_{GD}$.

Figure 22:
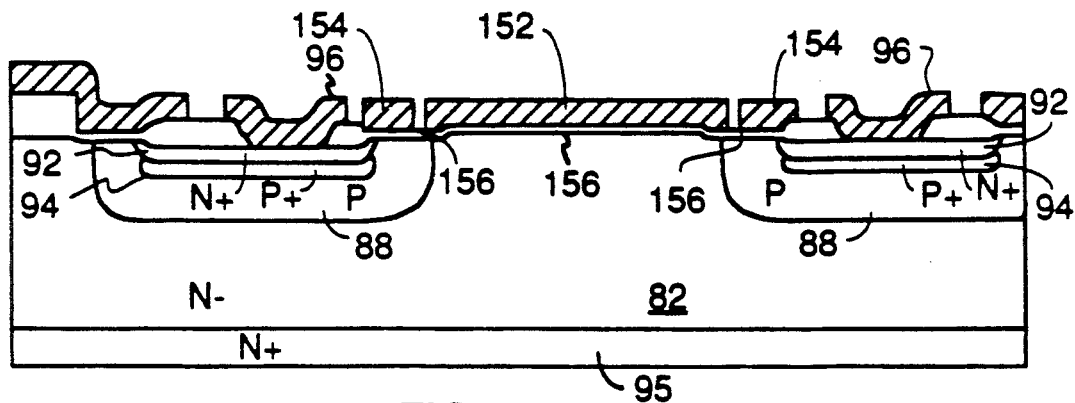
FIG. 22 illustrates an alternative embodiment of a MOSFET having a low $C_{GD}$ in accordance with the present invention which utilizes separate gates overlying an oxide layer of a single thickness.

In additional embodiments, the upper gate described with respect to FIGS. 13, 14, 16a, 19, and 21 is deposited on the same thickness of oxide as the lower gate and separated from the lower gate by a masking and etch process. A representative embodiment is shown in FIG. 22, where gates 152 and 154 are formed over a same thickness of oxide 156. Further, both gates 152 and 154 may overlie a portion of the channel region within the body region, as shown in FIG. 22, or, in another embodiment, only gate 154 may overlie the channel region within the body region. The remaining elements in FIG. 22 are identical to those shown in FIG. 5.

Figure 23:
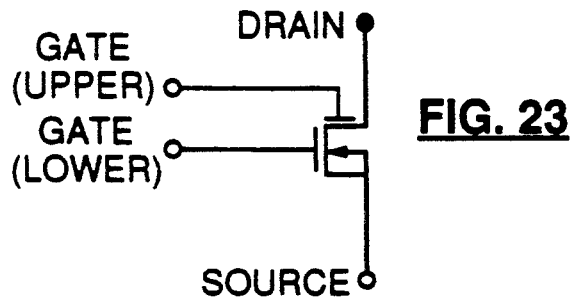
FIG. 23 shows a schematic representation of a MOSFET having an upper gate and a lower gate.

FIG. 23 shows a new schematic representation of the resulting structures described herein which utilize a separate upper gate and lower gate.

Figure 24:
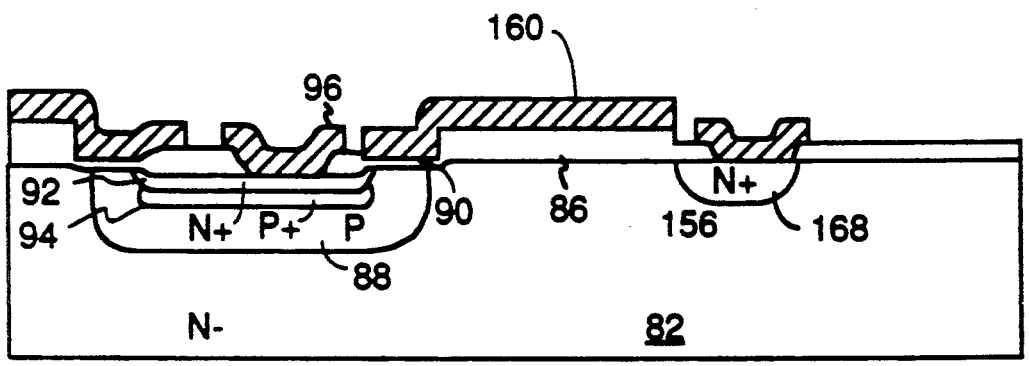
FIG. 24 illustrates an embodiment of a lateral MOSFET having a low $C_{GD}$ in accordance with the present invention.

FIG. 24 shows a lateral MOSFET in accordance with another embodiment of the invention, where gate portion 160 is formed over thick oxide 86, and gate portion 162 is formed over thin oxide 90. Gate portions 160 and 162 may be separated as described with respect to FIG. 13. The MOSFET of FIG. 24 is formed using steps similar to those used to form the vertical MOSFET of FIG. 5, except, in FIG. 23, N+ drain contact region 168 is formed in a top surface of substrate 82. Substrate 82 may be of an N or P type. If substrate 82 is of a P type, P body region 88 may be deleted.

Thus, an improved MOSFET has been described which exhibits a lower gate-to-drain capacitance $C_{GD}$, wherein source and body regions are precisely aligned with respect to a gate without the use of any critical masking steps, and wherein a parasitic bipolar transistor has been rendered inoperative. While particular embodiments of the present invention have been shown and described, it will be obvious to those skilled in the art that changes and modifications may be made without departing from this invention in its broader aspects. For example, all conductivity types may be made opposite to those specifically mentioned, and the various dimensions may be modified as necessary. Accordingly, the appended claims are to encompass within their scope all such changes and modifications that fall within the true spirit and scope of this invention.

What is claimed is:

1. A MOSFET structure comprising:
   a substrate of a first conductivity type having a top surface;
   a drain of said first conductivity type being more highly doped than said substrate;
   a body region of a second conductivity type formed in said top surface of said substrate;
   a source region of said first conductivity type formed in said top surface of said substrate and formed within said body region;
   a conductive gate having a first portion separated from a second portion, said first portion being insulated from a channel region within said body region located between said source region and a periphery of said body region by a first insulation layer portion, said second portion being insulated from said top surface of said substrate by a second insulation layer portion, wherein said first and second insulation layer portions have substantially identical thicknesses,
   wherein said first portion and said second portion each overlie a portion of said channel region within said body region.

2. The MOSFET structure of claim 1 wherein said drain is formed in said top surface of said substrate.

3. The MOSFET structure of claim 1 wherein said drain is formed on a bottom surface of said substrate.

4. A MOSFET pair structure comprising:
   a substrate of a first conductivity type having a first surface, a bottom surface of said substrate acting as a drain contact region for said MOSFET pair structure;
   a first and second body region of a second conductivity type formed in said top surface of said substrate and separated from one another by a first area of said top surface of said substrate;
   first and second source regions of said first conductivity type formed in said top surface of said substrate and within respective ones of said body regions;
   a conductive gate having an upper portion, a first lower portion, and a second lower portion, said first lower portion being insulated from a channel region within said first body region between said first source region and a periphery of said first body region by an insulation layer of a first thickness, said second lower portion being insulated from a channel region within said second body region between said second source region and a periphery of said second body region by an insulation layer of said first thickness, said upper portion being insulated from said first area of said top surface of said substrate by an insulation layer of a second thickness, wherein said second thickness is greater than said first thickness,
   wherein said upper portion of said gate is split into a first upper portion and a second upper portion, wherein neither said first upper portion nor said second upper portion overlies a central portion of said first area.

5. The MOSFET structure of claim 4 wherein said upper portion is shorted to said first and second lower portions.

6. The MOSFET structure of claim 4 wherein said upper portion is not shorted to said first and second lower portions.

7. A MOSFET structure comprising:
   a substrate of a first conductivity type having a top surface;
   a drain of said first conductivity type being more highly doped than said substrate;
   a body region of a second conductivity type formed in said top surface of said substrate;
   a source region of said first conductivity type formed in said top surface of said substrate and formed within said body region;
   a conductive gate having an upper gate portion electrically separated from a lower gate portion, said lower gate portion overlapping and being insulated from a first portion of a channel region within said body region located between said source region and a periphery of said body region by an insulation layer of a first thickness, said upper gate portion overlapping and being insulated from a second portion of said channel region by an insulation layer of a second thickness, said upper gate portion also extending over said top surface of said substrate of said first conductivity type, wherein said second thickness is greater than said first thickness.

8. The MOSFET structure of claim 7 wherein said upper gate portion is connected to receive an upper gate voltage for inverting said second portion of said channel region, and said lower gate portion is connected to receive a separate lower gate voltage for inverting said first portion of said channel region.

9. The MOSFET structure of claim 7 wherein said upper gate portion is connected to said source region through an AC short circuit.

10. The MOSFET structure of claim 7 wherein said upper gate portion overhangs said insulation layer of said second thickness.

11. A MOSFET structure comprising:
    a substrate of a first conductivity type having a top surface;
    a drain of said first conductivity type being more highly doped than said substrate;
    a body region of a second conductivity type formed in said top surface of said substrate;
    a body contact region of a second conductivity type formed within said body region and being more highly doped than said body region, wherein said body contact region does not extend to said top surface of said substrate;
    a source region of said first conductivity type, being more heavily doped than said substrate, formed within said body region so as to substantially completely overlie said body contact region; and
    a conductive gate insulated from and formed over a channel region within said body region located between said source region and a periphery of said body region.

12. The MOSFET structure of claim 11 further comprising a conductive electrode directly contacting said source region and not directly contacting said body contact region, whereby electrical contact with said body contact region is made through said source region, doping of said source region and said body contact region being of such a level as to cause said source region and said body contact region to be essentially in ohmic contact with each other.

13. The MOSFET structure of claim 11 further comprising a conductive electrode penetrating said source region so as to be in direct contact with said source region to said body contact region, thereby shorting said source region to said body contact region.

14. The MOSFET structure of claim 11 wherein said drain is formed in said top surface of said substrate.

15. The MOSFET structure of claim 11 wherein said drain is formed on a bottom surface of said substrate.

* * * * *

UNITED STATES PATENT AND TRADEMARK OFFICE
CERTIFICATE OF CORRECTION

PATENT NO.   :   5,121,176
DATED        :   June 9, 1992
INVENTOR(S)  :   Fred L. Quigg It is certified that error appears in the above-identified patent and that said Letters Patent is hereby corrected as shown below:

Col. 13, line 4, Claim 13: delete "to" and insert --and--.

Signed and Sealed this

Seventeenth Day of August, 1993

Attest:

BRUCE LEHMAN

*Attesting Officer*          *Commissioner of Patents and Trademarks*